United States Patent [19]

Rathbun et al.

[11] Patent Number: 4,628,006

[45] Date of Patent: Dec. 9, 1986

[54] PASSIVATION OF HYBRID MICROELECTRONIC CIRCUITS

[75] Inventors: Bonnie L. Rathbun, Ithaca; Philipp W. H. Schuessler, Endwell, both of N.Y.

[73] Assignee: The United States of America as represented by the Secretary of the Navy, Washington, D.C.

[21] Appl. No.: 572,340

[22] Filed: Jan. 20, 1984

[51] Int. Cl.$^4$ .......................... B32B 9/04; B05D 5/12; B05D 1/00
[52] U.S. Cl. .................................... 428/446; 427/93; 427/34; 427/96
[58] Field of Search .................. 427/12, 27, 34, 45.1, 427/93, 154, 155, 294, 296; 428/446, 447; 204/170, 159.13; 350/1.6

[56] References Cited

U.S. PATENT DOCUMENTS

| | | | |
|---|---|---|---|
| 3,297,465 | 1/1967 | Connell et al. | 427/47 |
| 4,349,609 | 9/1982 | Takeda et al. | 428/447 |
| 4,395,460 | 7/1983 | Gaul | 428/447 |

Primary Examiner—John F. Terapane
Assistant Examiner—T. J. Wallen
Attorney, Agent, or Firm—Robert F. Beers; Henry Hansen; Vincent T. Pace

[57] ABSTRACT

Passivation of a hybrid microelectronic device is achieved by plasma polymerization of hexamethyldisilazane on the device surface. A moisture impermeable thin film layer is deposited which protects the moisture sensitive components from corrosion. The layer is readily removable, however, in order to effect repairs to the device when necessary.

2 Claims, 2 Drawing Figures

PASSIVATION OF HYBRID MICROELECTRONIC CIRCUITS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to corrosion protection for electronic components, and more particularly to a method for passivating hybrid microelectronic devices with a plasma polymerized layer.

The electronics industry is continuously striving to prevent corrosion of microelectronic devices. This is especially true in hybrid devices which use a wide variety of construction materials. Attempts to passivate these types of circuits include total encapsulation with silicone compounds and surface passivation with silicone oxides or silicone nitrides. U.S. Pat. No. 4,163,072 issued to Soos, and U.S. Pat. No. 4,059,708 issued to Heiss, Jr. et al are illustrative of these methods.

Microelectronic devices for military use are subjected to stringent mechanical and environmental tests during various stages of their fabrication. These hybrid devices usually contain thin metallic film circuitry and discrete components such as capacitors, transistors and diodes bonded to the circuitry. These hybrid devices must be sealed to protect the internal components from exposure to moisture and other environmental agents which can degrade the microelectronics.

Presently, military hybrid devices are most often hermetically sealed by glass seals, soldering or welding all of which are rather costly processes. Furthermore, hybrid devices sealed by these methods are usually not easily, nor inexpensively, reopened if repair to interior parts becomes necessary.

Since most hybrid devices for military use are custom-made in small quantities, they are usually quite costly compared with their commercial counterparts. Thus, it becomes cost beneficial to repair a faulty military hybrid circuit rather than to scrap it. Such repairability requires that any passivating coating be easily removable.

SUMMARY OF THE INVENTION

Accordingly, one object of this invention is to protect hybrid microelectronic devices from corrosion due to moisture.

Another object of this invention is to provide a passivating layer which may be easily removed in order to repair the passivated device.

The above and other objects are realized in the present invention by means of a process which deposits a polymerized layer of Hexamethyldisilazane (HMDS) on the surface of the device to be protected. The HMDS is introduced into a deposition chamber in which the device to be coated is located. A plasma is generated from the HMDS by applying RF electromagnetic energy to the chamber. The plasma forms a polymerized layer on the surface of the device until a desired thickness is obtained.

Other objects, advantages and novel features of the invention will become apparent from the detailed description of the invention which follows the accompanying drawing wherein:

DETAILED DESCRIPTION OF THE INVENTION

Figure 1:
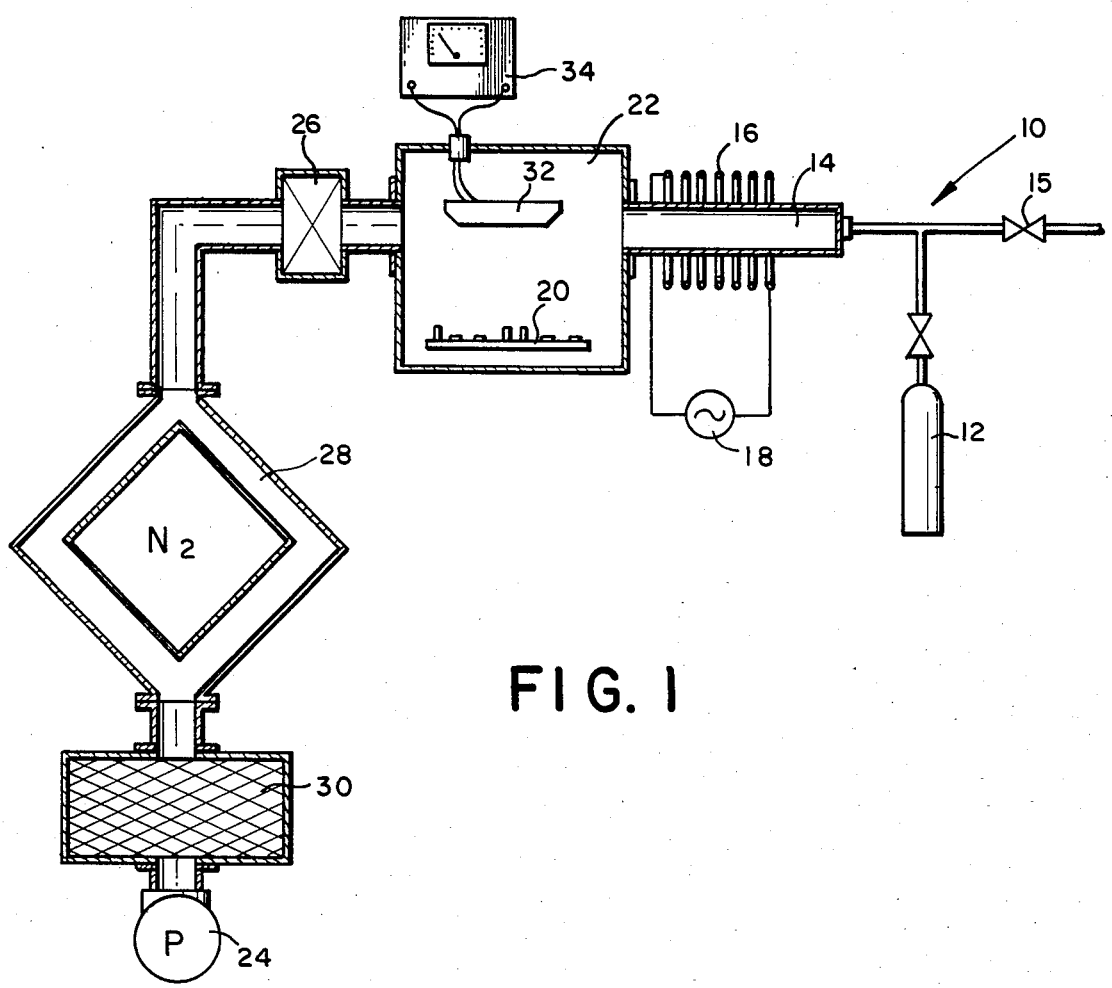
FIG. 1 is a schematic of a plasma polymerization system used to deposit a passivating agent according to the method of the present invention.

Referring now to FIG. 1 there is shown generally a plasma polymerization system 10 for carrying out the process according to the present invention. In the preferred technique of the invention, hexamethyldisilazane (HMDS) 12 is used as the passivating agent.

The HMDS 12 is introduced as a monomer into a reaction chamber 14 which is surrounded by an induction coil 16. A radio frequency generator 18 is connected to induction coil 16 to generate an electromagnetic field in reaction chamber 14. The interaction of the RF field on the HMDS 12 generates a plasma in chamber 14. A valve 15 is provided for introducing a carrier gas or venting chamber 14.

A hybrid microelectronic device 20 to be coated is placed in a deposition chamber 22. A vacuum is maintained on chamber 22 by means of vacuum pump 24. Pump 24 pulls a vacuum on chamber 22 through a valve 26, a liquid nitrogen trap 28, and a molecular sieve 30.

The plasma condenses and polymerizes on hybrid microelectronic device 20, forming a layer of HMDS 12 polymer. The thickness of HMDS polymer 12 deposited is monitored by a quartz crystal oscillator 32 disposed proximately to the microelectronic device 20 in deposition chamber 22. Oscillator 32 transmits a proportional signal to a readout instrument such as thickness meter 34.

EXAMPLE

A test run of the above described process was made utilizing 98% pure HMDS 12 with no carrier gas. A low power signal in the range of 10 to 30 w having a frequency of 13.56 MHz was used to generate the plasma. A vacuum in the range of 10–20 microns was drawn and maintained in the deposition chamber 22. The process was conducted at room temperature until a 1000 Å layer was deposited. This took about one hour.

The deposited coating yielded a relatively pinhole-free layer. The coated device was subjected to temperature and humidity tests. The results of these tests are given in Table I below in comparison to other surface passivation techniques.

TABLE I

| EFFECTS OF SURFACE PASSIVATION | | |
|---|---|---|
| Material | Coating Method | T & H Test |
| Control | No Coating | 50% Failed |
| | | 15.4% Drift |
| HMDS | Dip | 33% Failed |
| | | 7.5% Drift |
| HMDS | Plasma | No Failures |
| | | 1.7% Drift |
| PSS | Dip | No Failures |
| | | 4.2% Drift |
| "Silane" | Dip | 50% Failed |

| TABLE I-continued | | |
|---|---|---|
| EFFECTS OF SURFACE PASSIVATION | | |
| Material | Coating Method | T & H Test |
| | | 11.3% Drift |

Failed units were indicated by a high resistance value due to an open circuit. This was usually the result of a nichrome resistor disintegrating from reaction with moisture. The drift indicated in the table is the drifting of the circuit resistance from its original value. 1.7% drift is close to the acceptable limits of design for power-on thermal aging effects.

Figure 2:
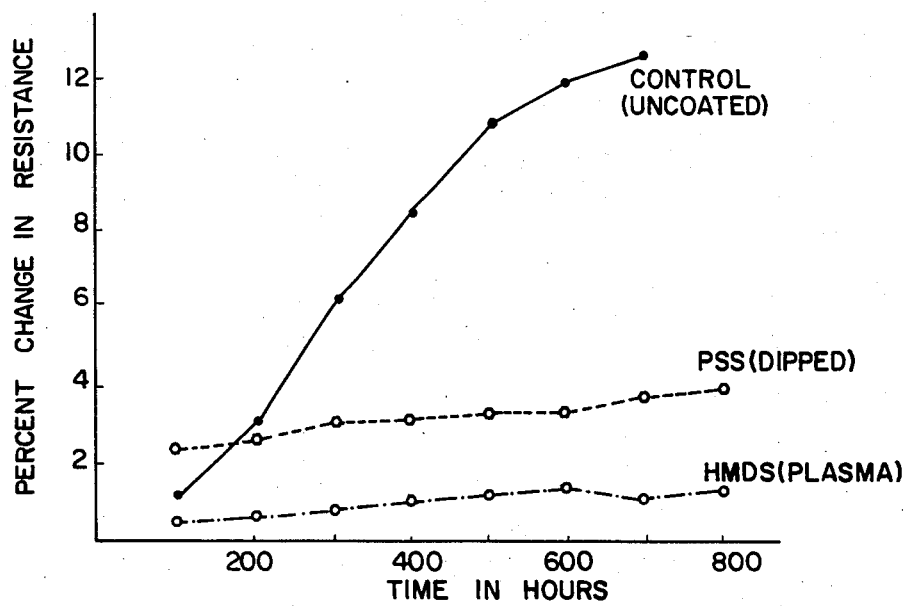
FIG. 2 is a graphical illustration of the average change in resistance as a function of time under test conditions for uncoated, PSS dipped, and HMDS plasma polymerized substrates.

FIG. 2 illustrates the average resistance change as a function of time under the test conditions for an uncoated device, a device dipped in polyphenylsilsesquioxane (PSS), and a device coated with the plasma polymerized HMDS. As can be seen, the HMDS treated device had the lowest average change over the testing period.

Removal of the coating was easily accomplished by using a soft eraser abrasion. Furthermore, no residue was left to interfere with repair work.

Some of the many advantages and features of the above-disclosed invention should now be apparent in view of the foregoing description. For example, a method has been described whereby hexamethyldisilazane (HMDS) is deposited on a hybrid microelectronic device to provide a moisture barrier for the various components which are subject to corrosion. Furthermore, the passivating layer deposited by this process is easily removable by soft eraser abrasion in order to make repairs to the coated device.

Numerous additional modifications and variations of the subject invention are possible in light of the above teachings. It is therefore to be understood that within the scope of the appended claims, the invention may be practiced otherwise than as specifically described herein.

What is claimed is:

1. A process for passivating a microelectronic device comprising the steps of:
    drawing a vacuum of 10 to 20 microns on a reaction chamber;
    introducing hexamethyldisilazane (HMDS) monomer into said reaction chamber;
    subjecting the monomer to electromagnetic energy at a frequency of 13.56 Mhz to form a plasma thereof within the chamber;
    exposing the device to said plasma for depositing a polymerized thin film layer of the HMDS on the device; and
    continuing said deposition until the layer of a desired thickness has been deposited on the device.

2. A passivated electronic component which is easily repaired comprising, in combination:
    a microelectronic device; and
    a coating of polymerized hexamethyldisilazane (HMDS) over the surface of said device.

* * * * *